United States Patent
Liu et al.

(10) Patent No.: US 11,955,524 B2
(45) Date of Patent: Apr. 9, 2024

(54) SEMI-FLOATING GATE DEVICE

(71) Applicant: Shanghai Huali Integrated Circuit Corporation, Shanghai (CN)

(72) Inventors: Heng Liu, Shanghai (CN); Jianghua Leng, Shanghai (CN); Zhigang Yang, Shanghai (CN); Tianpeng Guan, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 87 days.

(21) Appl. No.: 17/828,299

(22) Filed: May 31, 2022

(65) Prior Publication Data
US 2022/0384596 A1    Dec. 1, 2022

(30) Foreign Application Priority Data
Jun. 1, 2021    (CN) .......................... 202110608810.5

(51) Int. Cl.
| | |
|---|---|
| H01L 29/788 | (2006.01) |
| H01L 29/423 | (2006.01) |
| H01L 29/66 | (2006.01) |
| H10B 41/30 | (2023.01) |
| H10B 41/40 | (2023.01) |

(52) U.S. Cl.
CPC .. *H01L 29/42328* (2013.01); *H01L 29/42336* (2013.01); *H01L 29/66825* (2013.01); *H01L 29/7883* (2013.01); *H10B 41/30* (2023.02); *H10B 41/40* (2023.02)

(58) Field of Classification Search
None
See application file for complete search history.

(56) References Cited

U.S. PATENT DOCUMENTS 5,991,204 A * 11/1999 Chang .................... H10B 41/40
                                                      257/E27.081
2018/0151582 A1 * 5/2018 Wu ......................... H10B 41/20

FOREIGN PATENT DOCUMENTS

CN    110416085 A  * 11/2019

OTHER PUBLICATIONS

English translation of CN-110416085-A (Year: 2019).*

* cited by examiner

*Primary Examiner* — Xiaoming Liu
(74) *Attorney, Agent, or Firm* — Banner & Witcoff, Ltd.

(57) ABSTRACT

The present application discloses a semi-floating gate device. A floating gate structure covers a selected area of a first well region and is used to form a conductive channel. The floating gate structure further covers a surface of a lightly doped drain region, and a floating gate material layer and the lightly doped drain region contact at a dielectric layer window to form a PN structure. A source region is self-aligned with a first side surface of the floating gate structure. A first control gate is superposed on a top of the floating gate structure. A second control gate is disposed on a surface of the lightly doped drain region between the drain region and a second side surface of the floating gate structure. The first control gate and the second control gate are isolated by an inter-gate dielectric layer.

15 Claims, 3 Drawing Sheets

SEMI-FLOATING GATE DEVICE

CROSS-REFERENCES TO RELATED APPLICATIONS

This application claims priority to Chinese Patent Application No. 202110608810.5, filed on Jun. 1, 2021, the disclosure of which is incorporated herein by reference in entirety.

TECHNICAL FIELD

The present application relates to a semiconductor integrated circuit, in particular to a semi-floating gate transistor.

BACKGROUND

Semi-floating gate device has great potential to replace DRAM. It can read and write quickly and does not need capacitive devices. The difference between semi-floating gate device and ordinary floating gate device is that it uses embedded tunneling transistors and a PN junction to complete charging and discharging. Writing is realized through the channels of the embedded tunneling transistors and erasing is realized through the PN junction. Referring to FIG. 1, it is a structural diagram of the existing semi-floating gate device. The existing semi-floating gate devices include:

a second conductive type doped first well region 101, and a lightly doped source region 1021 and a lightly doped drain region 1022 consisting of a first conductive type doped second well region 102 formed in the semiconductor substrate.

A floating gate structure includes a gate trench, a floating gate dielectric layer 103, a dielectric layer window and a floating gate material layer 104.

The gate trench passes through the second well region 102 and a bottom surface of the gate trench enters the first well region 101. The floating gate dielectric layer 103 covers the bottom surface and side surfaces of the gate trench and extends to a surface of the lightly doped drain region 1022 outside the gate trench.

The floating gate material layer 104 completely fills the gate trench formed with the floating gate dielectric layer 103 and extends to the floating gate dielectric layer 103 and the dielectric layer window outside the gate trench. The dielectric layer window is located on the surface of the lightly doped drain region 1022 in the area of a dashed box 111. The floating gate material layer 104 and the lightly doped drain region 1022 contact at the dielectric layer window to form a PN structure.

A material of the floating gate dielectric layer 103 includes an oxide layer.

The floating gate material layer 104 is a second conductive type doped polysilicon layer.

A bottom of the floating gate structure covers the first well region 101, and the surface of the first well region 101 covered by the floating gate structure is used to form a conductive channel for electrically connecting the lightly doped source region 1021 and the lightly doped drain region 1022.

A first conductive type heavily doped source region 109 is formed in a selected surface area of the lightly doped source region 1021.

A first conductive type heavily doped drain region 110 is formed in a selected surface area of the lightly doped drain region 1022.

On a surface of the semiconductor substrate, the floating gate structure includes a first side surface and a second side surface.

The source region 109 is self-aligned with the first side surface of the floating gate structure.

A control gate covers a top of the floating gate structure and a surface of the lightly doped drain region 1022 between the drain region 110 and the second side surface of the floating gate structure. The control gate includes a gate conductive material layer 107, a gate dielectric layer 105 and an inter-gate dielectric layer 106. The gate dielectric layer 105 is used to realize the isolation between the gate conductive material layer 107 and the lightly doped drain region 1022, and the inter-gate dielectric layer 106 is used to realize the isolation between the gate conductive material layer 107 and the floating gate material layer 104.

The drain region 110 is self-aligned with the second side surface of the control gate.

Sidewalls 108 are formed on two side surfaces of the control gate.

The existing device in FIG. 1 has only a single control gate, which covers the floating gate and partially covers the substrate. During the writing and erasing operations, the charge is enabled to pass through the PN junction at the position of the dashed box 111 under the control of the control gate to realize tunneling. The reading operation of the device also needs to be carried out under the control of the control gate. This structure needs to share the same control gate for both reading and writing, and cannot realize simultaneous reading and writing.

BRIEF SUMMARY

The technical problem to be solved by the present application is to provide a semi-floating gate device, which can realize simultaneous reading and writing and obtain better signal holding characteristics.

In order to solve the technical problem, the semi-floating gate device provided by the present application includes:

a first conductive type lightly doped source region, a first conductive type lightly doped drain region and a second conductive type doped first well region formed in a semiconductor substrate.

A floating gate structure covers a selected area of the first well region, and a surface of the first well region covered by the floating gate structure is used to form a conductive channel for electrically connecting the lightly doped source region and the lightly doped drain region.

The floating gate structure includes a floating gate dielectric layer, a dielectric layer window and a floating gate material layer.

The floating gate structure further covers a surface of the lightly doped drain region, the dielectric layer window is located on the surface of the lightly doped drain region, and the floating gate material layer and the lightly doped drain region contact at the dielectric layer window to form a PN structure.

A first conductive type heavily doped source region is formed in a selected surface area of the lightly doped source region.

A first conductive type heavily doped drain region is formed in a selected surface area of the lightly doped drain region.

On a surface of the semiconductor substrate, the floating gate structure includes a first side surface and a second side surface.

The source region is self-aligned with the first side surface of the floating gate structure.

A first control gate is superposed on a top of the floating gate structure, and the first control gate is formed by superposing a first gate dielectric layer and a first gate conductive material layer.

A second control gate is disposed on a surface of the lightly doped drain region between the drain region and the second side surface of the floating gate structure, and the second control gate is formed by superposing a second gate dielectric layer and a second gate conductive material layer.

The first control gate and the second control gate are isolated by an inter-gate dielectric layer.

The first control gate is used to control a reading operation of the semi-floating gate device.

The second control gate is used to control an erasing and writing operation of the semi-floating gate device.

As a further improvement, the semiconductor substrate includes a silicon substrate.

As a further improvement, the floating gate structure further includes a gate trench, a bottom surface of the gate trench enters the first well region, and the lightly doped source region is located on the first well region and contacts a first side surface of the gate trench; the lightly doped drain region is located on the first well region and contacts a second side surface of the gate trench.

The floating gate dielectric layer covers the bottom surface and side surfaces of the gate trench and extends to the surface of the lightly doped drain region outside the gate trench.

The floating gate material layer completely fills the gate trench formed with the floating gate dielectric layer and extends to the floating gate dielectric layer and the dielectric layer window outside the gate trench.

As a further improvement, a material of the floating gate dielectric layer includes an oxide layer.

The floating gate material layer is a second conductive type doped polysilicon layer.

As a further improvement, the first gate dielectric layer is an oxide layer and the first gate conductive material layer is a polysilicon layer.

Alternatively, the first gate dielectric layer is a high-k material layer and the first gate conductive material layer is a metal gate.

As a further improvement, the second gate dielectric layer is an oxide layer and the second gate conductive material layer is a polysilicon layer.

Alternatively, the second gate dielectric layer is a high-k material layer and the second gate conductive material layer is a metal gate.

As a further improvement, a first side surface and a second side surface of the first control gate are respectively aligned with the first side surface and the second side surface of the floating gate structure.

As a further improvement, a first side surface of the second control gate and the second side surface of the first control gate are isolated by the inter-gate dielectric layer.

The drain region is self-aligned with a second side surface of the second control gate.

As a further improvement, sidewalls are formed on the first side surface of the first control gate and the second side surface of the second control gate.

As a further improvement, a top surface of the first control gate is in flush with a top surface of the second control gate.

As a further improvement, both the lightly doped source region and the lightly doped drain region consist of a first conductive type doped second well region formed on the surface of the first well region, and the gate trench passes through the second well region to divide the second well region into the lightly doped source region and the lightly doped drain region.

As a further improvement, ion implantation dose for second conductive type doping in the first well region is 0.25 e14 $cm^{-2}$-2.50 e14 $cm^{-2}$ and ion implantation energy is 55 keV-220 keV.

As a further improvement, the doping concentration of the first well region decreases in a gradient from top to bottom.

As a further improvement, ion implantation dose for first conductive type doping in the second well region is 4.5 e12 $cm^{-2}$-2.50 e13 $cm^{-2}$ and ion implantation energy is 45 keV-85 keV.

As a further improvement, ion implantation dose for second conductive type doping in the floating gate material layer is 5.00 e12 $cm^{-2}$-3.60 e13 $cm^{-2}$ and ion implantation energy is 2 keV-12 keV.

In the present application, according to the reading and erasing characteristics of the semi-floating gate device, the control gate is specially configured, which is mainly divided into a first control gate and a second control gate; the first control gate is located at the top of the floating gate structure, which can realize the control of the reading operation of the semi-floating gate device; the second control gate is disposed on the surface of the lightly doped drain region between the drain region and the second side surface of the floating gate structure, which can realize the control of the erasing and writing operation of the semi-floating gate device. By applying different voltages to the first control gate and the second control gate, simultaneous reading and writing can be realized, and the two control gates are independent and can obtain better signal holding characteristics.

The structures of the first control gate and the second control gate in the present application are simple, and the two control gates are in flush, so that the fabrication methods are diversified and the process is simple.

BRIEF DESCRIPTION OF THE DRAWINGS

The present application will be described in further detail below in combination with specific embodiments with reference to the drawings.

DETAILED DESCRIPTION OF THE APPLICATION

Figure 1:
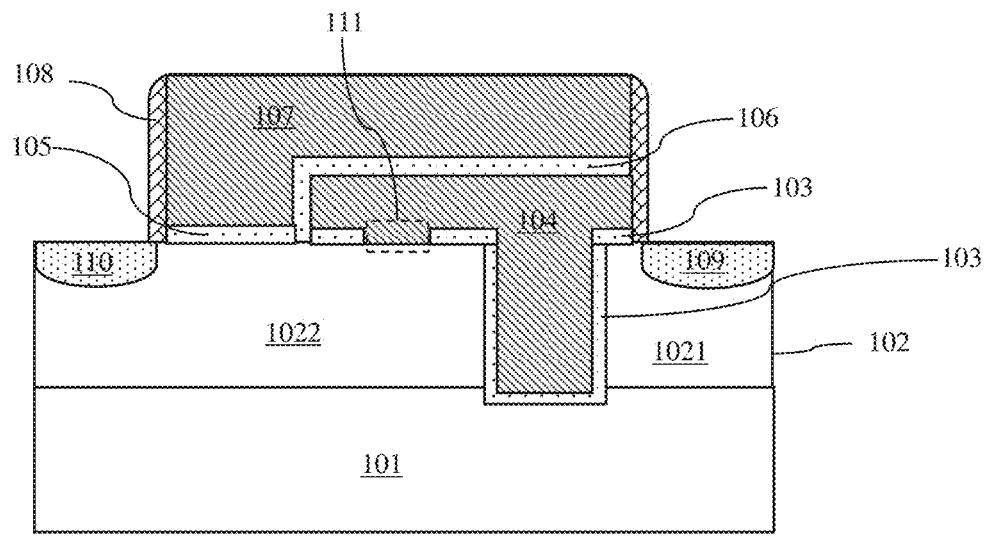
FIG. 1 illustrates a structural diagram of an existing semi-floating gate device.
Figure 2:
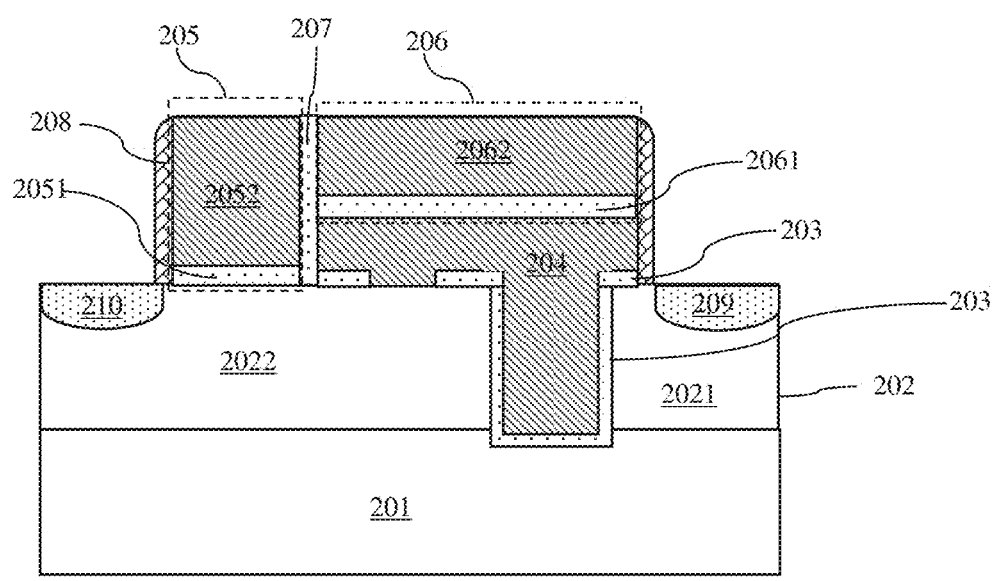
FIG. 2 illustrates a structural diagram of a semi-floating gate device according to embodiment 1 of the present application.

Semi-floating gate device according to embodiment 1 of the present application:

Referring to FIG. 2, it is a structural diagram of a semi-floating gate device according to embodiment 1 of the present application. The semi-floating gate device according to embodiment 1 of the present application includes:

a first conductive type lightly doped source region 2021, a first conductive type lightly doped drain region 2022 and a second conductive type doped first well region 201 formed in a semiconductor substrate.

In embodiment 1 of the present application, the semiconductor substrate is a silicon substrate.

A floating gate structure covers a selected area of the first well region 201, and a surface of the first well region 201 covered by the floating gate structure is used to form a conductive channel for electrically connecting the lightly doped source region 2021 and the lightly doped drain region 2022.

The floating gate structure includes a floating gate dielectric layer 203, a dielectric layer window and a floating gate material layer 204.

The floating gate structure further covers a surface of the lightly doped drain region 2022, the dielectric layer window is located on the surface of the lightly doped drain region 2022, and the floating gate material layer 204 and the lightly doped drain region 2022 contact at the dielectric layer window to form a PN structure.

A first conductive type heavily doped source region 209 is formed in a selected surface area of the lightly doped source region 2021.

A first conductive type heavily doped drain region 210 is formed in a selected surface area of the lightly doped drain region 2022.

On a surface of the semiconductor substrate, the floating gate structure includes a first side surface and a second side surface.

The source region 209 is self-aligned with the first side surface of the floating gate structure.

A first control gate 206 is superposed on a top of the floating gate structure, and the first control gate 206 is formed by superposing a first gate dielectric layer 2061 and a first gate conductive material layer 2062.

A second control gate 205 is disposed on a surface of the lightly doped drain region 2022 between the drain region 210 and the second side surface of the floating gate structure, and the second control gate 205 is formed by superposing a second gate dielectric layer 2051 and a second gate conductive material layer 2052.

The first control gate 206 and the second control gate 205 are isolated by an inter-gate dielectric layer 207.

The first control gate 206 is used to control a reading operation of the semi-floating gate device.

The second control gate 205 is used to control an erasing and writing operation of the semi-floating gate device.

In embodiment 1 of the present application, the floating gate structure further includes a gate trench, a bottom surface of the gate trench enters the first well region 201, and the lightly doped source region 2021 is located on the first well region 201 and contacts a first side surface of the gate trench; the lightly doped drain region 2022 is located on the first well region 201 and contacts a second side surface of the gate trench. In other embodiments, the floating gate structure may be a plane gate and the gate trench is not needed in this case.

The floating gate dielectric layer 203 covers the bottom surface and side surfaces of the gate trench and extends to the surface of the lightly doped drain region 2022 outside the gate trench.

The floating gate material layer 204 completely fills the gate trench formed with the floating gate dielectric layer 203 and extends to the floating gate dielectric layer 203 and the dielectric layer window outside the gate trench.

A material of the floating gate dielectric layer 203 includes an oxide layer.

The floating gate material layer 204 is a second conductive type doped polysilicon layer.

In embodiment 1 of the present application, the first gate dielectric layer 2061 is an oxide layer and the first gate conductive material layer 2062 is a polysilicon layer.

The second gate dielectric layer 2051 is an oxide layer and the second gate conductive material layer 2052 is a polysilicon layer.

A first side surface and a second side surface of the first control gate 206 are respectively aligned with the first side surface and the second side surface of the floating gate structure.

A first side surface of the second control gate 205 and the second side surface of the first control gate 206 are isolated by the inter-gate dielectric layer 207.

The drain region 210 is self-aligned with a second side surface of the second control gate 205.

Sidewalls 208 are formed on the first side surface of the first control gate 206 and the second side surface of the second control gate 205.

A top surface of the first control gate 206 is in flush with a top surface of the second control gate 205.

Both the lightly doped source region 2021 and the lightly doped drain region 2022 consist of a first conductive type doped second well region 202 formed on the surface of the first well region 201, and the gate trench passes through the second well region 202 to divide the second well region 202 into the lightly doped source region 2021 and the lightly doped drain region 2022.

Ion implantation dose for second conductive type doping in the first well region 201 is 0.25 e14 $cm^{-2}$-2.50 e14 $cm^{-2}$ and ion implantation energy is 55 keV-220 keV.

The doping concentration of the first well region 201 decreases in a gradient from top to bottom.

Ion implantation dose for first conductive type doping in the second well region 202 is 4.5 e12 $cm^{-2}$-2.50 e13 $cm^{-2}$ and ion implantation energy is 45 keV-85 keV.

Ion implantation dose for second conductive type doping in the floating gate material layer 204 is 5.00 e12 $cm^{-2}$-3.60 e13 $cm^{-2}$ and ion implantation energy is 2 keV-12 keV.

In embodiment 1 of the present application, the first conductive type is N-type and the second conductive type is P-type. In other embodiments, the first conductive type may be P-type and the second conductive type may be N-type.

In embodiment of the present application, according to the reading and erasing characteristics of the semi-floating gate device, the control gate is specially configured, which is mainly divided into a first control gate 206 and a second control gate 205; the first control gate 206 is located at the top of the floating gate structure, which can realize the control of the reading operation of the semi-floating gate device; the second control gate 205 is disposed on the surface of the lightly doped drain region 2022 between the drain region 210 and the second side surface of the floating gate structure, which can realize the control of the erasing and writing operation of the semi-floating gate device. By applying different voltages to the first control gate 206 and the second control gate 205, simultaneous reading and writing can be realized, and the two control gates are independent and can obtain better signal holding characteristics.

The structures of the first control gate 206 and the second control gate 205 in embodiment 1 of the present application are simple, and the two control gates are in flush, so that the fabrication methods are diversified and the process is simple.

Figure 3:
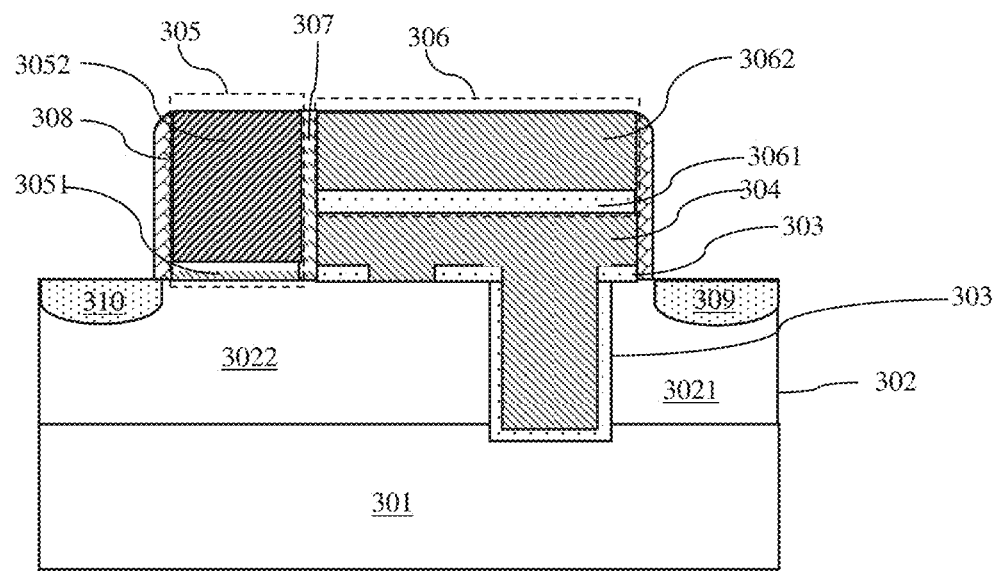
FIG. 3 illustrates a structural diagram of a semi-floating gate device according to embodiment 2 of the present application.

Semi-floating gate device according to embodiment 2 of the present application:

Referring to FIG. 3, it illustrates a structural diagram of a semi-floating gate device according to embodiment 2 of the present application. The semi-floating gate device according to embodiment 2 of the present application includes:

a first conductive type lightly doped source region 3021, a first conductive type lightly doped drain region 3022 and a second conductive type doped first well region 301 formed in a semiconductor substrate.

In embodiment 1 of the present application, the semiconductor substrate is a silicon substrate.

A floating gate structure covers a selected area of the first well region 301, and a surface of the first well region 301 covered by the floating gate structure is used to form a conductive channel for electrically connecting the lightly doped source region 3021 and the lightly doped drain region 3022.

The floating gate structure includes a floating gate dielectric layer 303, a dielectric layer window and a floating gate material layer 304.

The floating gate structure further covers a surface of the lightly doped drain region 3022, the dielectric layer window is located on the surface of the lightly doped drain region 3022, and the floating gate material layer 304 and the lightly doped drain region 3022 contact at the dielectric layer window to form a PN structure.

A first conductive type heavily doped source region 309 is formed in a selected surface area of the lightly doped source region 3021.

A first conductive type heavily doped drain region 310 is formed in a selected surface area of the lightly doped drain region 3022.

On a surface of the semiconductor substrate, the floating gate structure includes a first side surface and a second side surface.

The source region 309 is self-aligned with the first side surface of the floating gate structure.

A first control gate 306 is superposed on a top of the floating gate structure, and the first control gate 306 is formed by superposing a first gate dielectric layer 3061 and a first gate conductive material layer 3062.

A second control gate 305 is disposed on a surface of the lightly doped drain region 3022 between the drain region 310 and the second side surface of the floating gate structure, and the second control gate 305 is formed by superposing a second gate dielectric layer 3051 and a second gate conductive material layer 3052.

The first control gate 306 and the second control gate 305 are isolated by an inter-gate dielectric layer 307.

The first control gate 306 is used to control a reading operation of the semi-floating gate device.

The second control gate 305 is used to control an erasing and writing operation of the semi-floating gate device.

In embodiment 2 of the present application, the floating gate structure further includes a gate trench, a bottom surface of the gate trench enters the first well region 301, and the lightly doped source region 3021 is located on the first well region 301 and contacts a first side surface of the gate trench; the lightly doped drain region 3022 is located on the first well region 301 and contacts a second side surface of the gate trench. In other embodiments, the floating gate structure may be a plane gate and the gate trench is not needed in this case.

The floating gate dielectric layer 303 covers the bottom surface and side surfaces of the gate trench and extends to the surface of the lightly doped drain region 3022 outside the gate trench.

The floating gate material layer 304 completely fills the gate trench formed with the floating gate dielectric layer 303 and extends to the floating gate dielectric layer 303 and the dielectric layer window outside the gate trench.

A material of the floating gate dielectric layer 303 includes an oxide layer.

The floating gate material layer 304 is a second conductive type doped polysilicon layer.

In embodiment 2 of the present application, the first gate dielectric layer 3061 is an oxide layer and the first gate conductive material layer 3062 is a polysilicon layer.

The second gate dielectric layer 3051 is a high-k material layer, and the second gate conductive material layer 3052 is a metal gate. Compared with embodiment 1 of the present application, the second control gate 305 in embodiment 2 of the present application is a High-K Metal Gate (HKMG), and the use of HKMG can reduce the gate leakage of the second control gate 302.

A first side surface and a second side surface of the first control gate 306 are respectively aligned with the first side surface and the second side surface of the floating gate structure.

A first side surface of the second control gate 305 and the second side surface of the first control gate 306 are isolated by the inter-gate dielectric layer 307.

The drain region 310 is self-aligned with a second side surface of the second control gate 305.

Sidewalls 308 are formed on the first side surface of the first control gate 306 and the second side surface of the second control gate 305.

A top surface of the first control gate 306 is in flush with a top surface of the second control gate 305.

Both the lightly doped source region 3021 and the lightly doped drain region 3022 consist of a first conductive type doped second well region 302 formed on the surface of the first well region 301, and the gate trench passes through the second well region 302 to divide the second well region 302 into the lightly doped source region 3021 and the lightly doped drain region 3022.

Ion implantation dose for second conductive type doping in the first well region 301 is 0.25 e14 $cm^{-2}$-2.50 e14 $cm^{-2}$ and ion implantation energy is 55 keV-230 keV.

The doping concentration of the first well region 301 decreases in a gradient from top to bottom.

Ion implantation dose for first conductive type doping in the second well region 302 is 4.5 e12 $cm^{-2}$-2.50 e13 $cm^{-2}$ and ion implantation energy is 45 keV-85 keV.

Ion implantation dose for second conductive type doping in the floating gate material layer 304 is 5.00 e12 $cm^{-2}$-3.60 e13 $cm^{-2}$ and ion implantation energy is 2 keV-12 keV.

In embodiment 2 of the present application, the first conductive type is N-type and the second conductive type is P-type. In other embodiments, the first conductive type may be P-type and the second conductive type may be N-type.

Figure 4:
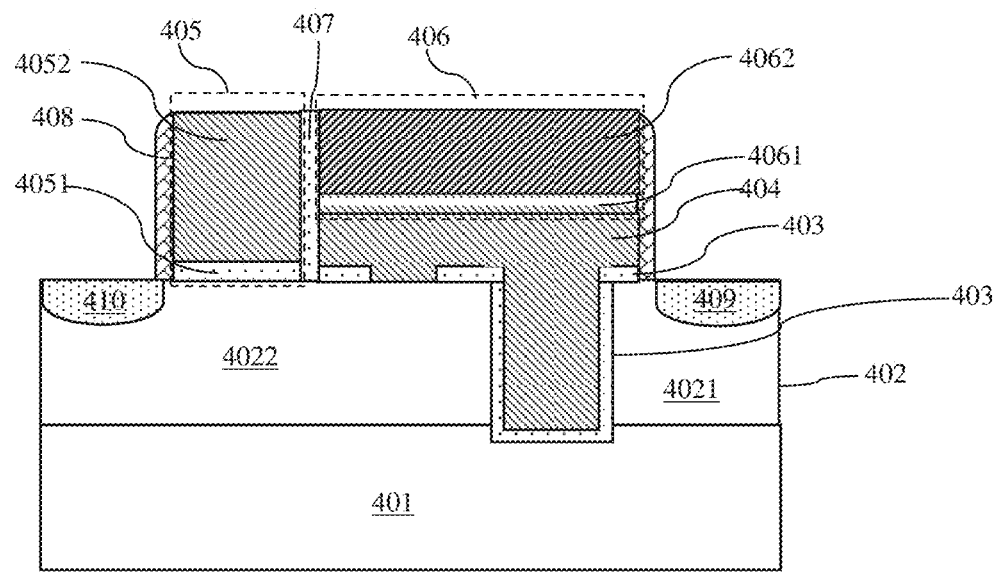
FIG. 4 illustrates a structural diagram of a semi-floating gate device according to embodiment 3 of the present application.
Figure 5:
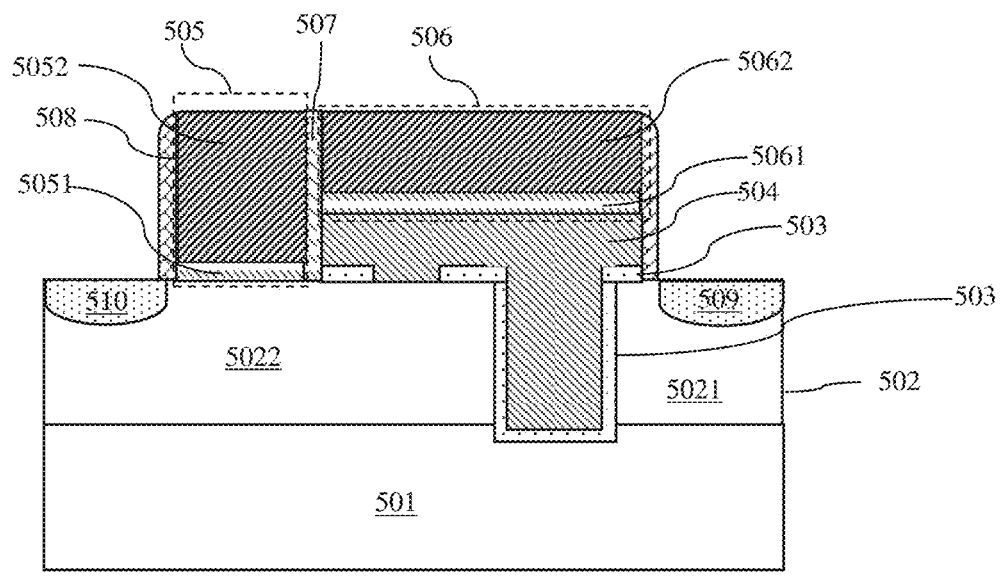
FIG. 5 illustrates a structural diagram of a semi-floating gate device according to embodiment 4 of the present application.

Semi-floating gate device according to embodiment 3 of the present application:

Referring to FIG. 4, it is a structural diagram of a semi-floating gate device according to embodiment 3 of the present application. The semi-floating gate device according to embodiment 3 of the present application includes:

a first conductive type lightly doped source region 4021, a first conductive type lightly doped drain region 4022 and a second conductive type doped first well region 401 formed in a semiconductor substrate.

In embodiment 3 of the present application, the semiconductor substrate is a silicon substrate.

A floating gate structure covers a selected area of the first well region 401, and a surface of the first well region 401 covered by the floating gate structure is used to form a conductive channel for electrically connecting the lightly doped source region 4021 and the lightly doped drain region 4022.

The floating gate structure includes a floating gate dielectric layer 403, a dielectric layer window and a floating gate material layer 404.

The floating gate structure further covers a surface of the lightly doped drain region 4022, the dielectric layer window is located on the surface of the lightly doped drain region 4022, and the floating gate material layer 404 and the lightly doped drain region 4022 contact at the dielectric layer window to form a PN structure.

A first conductive type heavily doped source region 409 is formed in a selected surface area of the lightly doped source region 4021.

A first conductive type heavily doped drain region 410 is formed in a selected surface area of the lightly doped drain region 4022.

On a surface of the semiconductor substrate, the floating gate structure includes a first side surface and a second side surface.

The source region 409 is self-aligned with the first side surface of the floating gate structure.

A first control gate 406 is superposed on a top of the floating gate structure, and the first control gate 406 is formed by superposing a first gate dielectric layer 4061 and a first gate conductive material layer 4062.

A second control gate 405 is disposed on a surface of the lightly doped drain region 4022 between the drain region 410 and the second side surface of the floating gate structure, and the second control gate 405 is formed by superposing a second gate dielectric layer 4051 and a second gate conductive material layer 4052.

The first control gate 406 and the second control gate 405 are isolated by an inter-gate dielectric layer 407.

The first control gate 406 is used to control a reading operation of the semi-floating gate device.

The second control gate 405 is used to control an erasing and writing operation of the semi-floating gate device.

In embodiment 3 of the present application, the floating gate structure further includes a gate trench, a bottom surface of the gate trench enters the first well region 401, and the lightly doped source region 4021 is located on the first well region 401 and contacts a first side surface of the gate trench; the lightly doped drain region 4022 is located on the first well region 401 and contacts a second side surface of the gate trench. In other embodiments, the floating gate structure may be a plane gate and the gate trench is not needed in this case.

The floating gate dielectric layer 403 covers the bottom surface and side surfaces of the gate trench and extends to the surface of the lightly doped drain region 4022 outside the gate trench.

The floating gate material layer 404 completely fills the gate trench formed with the floating gate dielectric layer 403 and extends to the floating gate dielectric layer 403 and the dielectric layer window outside the gate trench.

A material of the floating gate dielectric layer 403 includes an oxide layer.

The floating gate material layer 404 is a second conductive type doped polysilicon layer.

In embodiment 3 of the present application, the first gate dielectric layer 4061 is a high-k material layer, and the first gate conductive material layer 4062 is a metal gate. Compared with embodiment 1 of the present application, the first control gate 405 in embodiment 3 of the present application is an HKMG, and the use of the HKMG can improve the charge storage capacity of the floating gate structure.

The first gate dielectric layer 4061 is an oxide layer and the first gate conductive material layer 4062 is a polysilicon layer.

A first side surface and a second side surface of the first control gate 406 are respectively aligned with the first side surface and the second side surface of the floating gate structure.

A first side surface of the second control gate 405 and the second side surface of the first control gate 406 are isolated by the inter-gate dielectric layer 407.

The drain region 410 is self-aligned with a second side surface of the second control gate 405.

Sidewalls 408 are formed on the first side surface of the first control gate 406 and the second side surface of the second control gate 405.

A top surface of the first control gate 406 is in flush with a top surface of the second control gate 405.

Both the lightly doped source region 4021 and the lightly doped drain region 4022 consist of a first conductive type doped second well region 402 formed on the surface of the first well region 401, and the gate trench passes through the second well region 402 to divide the second well region 402 into the lightly doped source region 4021 and the lightly doped drain region 4022.

Ion implantation dose for second conductive type doping in the first well region 401 is 0.25 e14 $cm^{-2}$-2.50 e14 $cm^{-2}$ and ion implantation energy is 55 keV-240 keV.

The doping concentration of the first well region 401 decreases in a gradient from top to bottom.

Ion implantation dose for first conductive type doping in the second well region 402 is 4.5 e12 $cm^{-2}$-2.50 e13 $cm^{-2}$ and ion implantation energy is 45 keV-85 keV.

Ion implantation dose for second conductive type doping in the floating gate material layer 404 is 5.00 e12 $cm^{-2}$-3.60 e13 $cm^{-2}$ and ion implantation energy is 2 keV-12 keV.

In embodiment 3 of the present application, the first conductive type is N-type and the second conductive type is P-type. In other embodiments, the first conductive type may be P-type and the second conductive type may be N-type.

Semi-floating gate device according to embodiment 4 of the present application:

Referring to FIG. 4, it is a structural diagram of a semi-floating gate device according to embodiment 4 of the present application. The semi-floating gate device according to embodiment 4 of the present application includes:

a first conductive type lightly doped source region 5021, a first conductive type lightly doped drain region 5022 and a second conductive type doped first well region 501 formed in a semiconductor substrate.

In embodiment 4 of the present application, the semiconductor substrate is a silicon substrate.

A floating gate structure covers a selected area of the first well region 501, and a surface of the first well region 501 covered by the floating gate structure is used to form a conductive channel for electrically connecting the lightly doped source region 5021 and the lightly doped drain region 5022.

The floating gate structure includes a floating gate dielectric layer 503, a dielectric layer window and a floating gate material layer 504.

The floating gate structure further covers a surface of the lightly doped drain region 5022, the dielectric layer window is located on the surface of the lightly doped drain region 5022, and the floating gate material layer 504 and the lightly doped drain region 5022 contact at the dielectric layer window to form a PN structure.

A first conductive type heavily doped source region 509 is formed in a selected surface area of the lightly doped source region 5021.

A first conductive type heavily doped drain region 510 is formed in a selected surface area of the lightly doped drain region 5022.

On a surface of the semiconductor substrate, the floating gate structure includes a first side surface and a second side surface.

The source region 509 is self-aligned with the first side surface of the floating gate structure.

A first control gate 506 is superposed on a top of the floating gate structure, and the first control gate 506 is formed by superposing a first gate dielectric layer 5061 and a first gate conductive material layer 5062.

A second control gate 505 is disposed on a surface of the lightly doped drain region 5022 between the drain region 510 and the second side surface of the floating gate structure, and the second control gate 505 is formed by superposing a second gate dielectric layer 5051 and a second gate conductive material layer 5052.

The first control gate 506 and the second control gate 505 are isolated by an inter-gate dielectric layer 507.

The first control gate 506 is used to control a reading operation of the semi-floating gate device.

The second control gate 505 is used to control an erasing and writing operation of the semi-floating gate device.

In embodiment 4 of the present application, the floating gate structure further includes a gate trench, a bottom surface of the gate trench enters the first well region 501, and the lightly doped source region 5021 is located on the first well region 501 and contacts a first side surface of the gate trench; the lightly doped drain region 5022 is located on the first well region 501 and contacts a second side surface of the gate trench. In other embodiments, the floating gate structure may be a plane gate and the gate trench is not needed in this case.

The floating gate dielectric layer 503 covers the bottom surface and side surfaces of the gate trench and extends to the surface of the lightly doped drain region 5022 outside the gate trench.

The floating gate material layer 504 completely fills the gate trench formed with the floating gate dielectric layer 503 and extends to the floating gate dielectric layer 503 and the dielectric layer window outside the gate trench.

A material of the floating gate dielectric layer 503 includes an oxide layer.

The floating gate material layer 504 is a second conductive type doped polysilicon layer.

In embodiment 4 of the present application, the first gate dielectric layer 5061 is a high-k material layer, and the first gate conductive material layer 5062 is a metal gate. Compared with embodiment 1 of the present application, the first control gate 505 in embodiment of the present application is an HKMG, and the use of the HKMG can improve the charge storage capacity of the floating gate structure.

The second gate dielectric layer 5051 is a high-k material layer, and the second gate conductive material layer 5052 is a metal gate. Compared with embodiment 1 of the present application, the second control gate 505 in embodiment of the present application is an HKMG, and the use of the HKMG can reduce the gate leakage of the second control gate 502.

A first side surface and a second side surface of the first control gate 506 are respectively aligned with the first side surface and the second side surface of the floating gate structure.

A first side surface of the second control gate 505 and the second side surface of the first control gate 506 are isolated by the inter-gate dielectric layer 507.

The drain region 510 is self-aligned with a second side surface of the second control gate 505.

Sidewalls 508 are formed on the first side surface of the first control gate 506 and the second side surface of the second control gate 505.

A top surface of the first control gate 506 is in flush with a top surface of the second control gate 505.

Both the lightly doped source region 5021 and the lightly doped drain region 5022 consist of a first conductive type doped second well region 502 formed on the surface of the first well region 501, and the gate trench passes through the second well region 502 to divide the second well region 502 into the lightly doped source region 5021 and the lightly doped drain region 5022.

Ion implantation dose for second conductive type doping in the first well region 501 is 0.25 e14 $cm^{-2}$-2.50 e14 $cm^{-2}$ and ion implantation energy is 55 keV-250 keV.

The doping concentration of the first well region 501 decreases in a gradient from top to bottom.

Ion implantation dose for first conductive type doping in the second well region 502 is 4.5 e12 $cm^{-2}$-2.50 e13 $cm^{-2}$ and ion implantation energy is 45 keV-85 keV.

Ion implantation dose for second conductive type doping in the floating gate material layer 204 is 5.00 e12 $cm^{-2}$-3.60 e13 $cm^{-2}$ and ion implantation energy is 2 keV-12 keV.

In embodiment 4 of the present application, the first conductive type is N-type and the second conductive type is P-type. In other embodiments, the first conductive type may be P-type and the second conductive type may be N-type.

The present application has been described in detail through specific embodiments, which, however, do not constitute limitations on the present application. Without departing from the principles of the present application, those skilled in the art can also make many modifications and improvements, which should also be regarded as the scope of protection of the present application.

What is claimed is:

1. A semi-floating gate device, wherein the semi-floating gate device comprises:
    a first conductive type lightly doped source region, a first conductive type lightly doped drain region, and a second conductive type doped first well region formed in a semiconductor substrate;
    a floating gate structure covers a selected area of the first well region, and a surface of the first well region covered by the floating gate structure is used to form a conductive channel for electrically connecting the lightly doped source region and the lightly doped drain region;

the floating gate structure comprises a floating gate dielectric layer, a dielectric layer window, and a floating gate material layer;

the floating gate material layer is a second conductive type doped polysilicon layer;

the floating gate structure further covers a surface of the lightly doped drain region, the dielectric layer window is located on the surface of the lightly doped drain region, and the floating gate material layer and the lightly doped drain region contact at the dielectric layer window to form a PN structure;

a first conductive type heavily doped source region is formed in a selected surface area of the lightly doped source region;

a first conductive type heavily doped drain region is formed in a selected surface area of the lightly doped drain region;

on a surface of the semiconductor substrate, the floating gate structure comprises a first side surface and a second side surface;

the first conductive type heavily doped source region is self-aligned with the first side surface of the floating gate structure;

a first control gate is superposed on a top of the floating gate structure, and the first control gate is formed by superposing a first gate dielectric layer and a first gate conductive material layer;

a second control gate is disposed on a surface of the lightly doped drain region between the first conductive type heavily doped drain region and the second side surface of the floating gate structure, and the second control gate is formed by superposing a second gate dielectric layer and a second gate conductive material layer;

the first control gate and the second control gate are isolated by an inter-gate dielectric layer;

the inter-gate dielectric layer is also located between the second control gate and the second side surface of the floating gate structure;

the first control gate is used to control a reading operation of the semi-floating gate device;

the second control gate is used to control an erasing and writing operation of the semi-floating gate device; and by independently applying different voltages to the first control gate and the second control gate, simultaneous reading and writing can be achieved.

2. The semi-floating gate device according to claim 1, wherein the semiconductor substrate comprises a silicon substrate.

3. The semi-floating gate device according to claim 1, wherein the floating gate structure further comprises a gate trench, a bottom surface of the gate trench enters the first well region, and the lightly doped source region is located on the first well region and contacts a first side surface of the gate trench; the lightly doped drain region is located on the first well region and contacts a second side surface of the gate trench;

the floating gate dielectric layer covers the bottom surface and side surfaces of the gate trench and extends to the surface of the lightly doped drain region outside the gate trench; and the floating gate material layer completely fills the gate trench formed with the floating gate dielectric layer and extends to the floating gate dielectric layer and the dielectric layer window outside the gate trench.

4. The semi-floating gate device according to claim 3, wherein a material of the floating gate dielectric layer comprises an oxide layer.

5. The semi-floating gate device according to claim 1, wherein the first gate dielectric layer is an oxide layer and the first gate conductive material layer is a polysilicon layer; or the first gate dielectric layer is a high-k material layer and the first gate conductive material layer is a metal gate.

6. The semi-floating gate device according to claim 1, wherein the second gate dielectric layer is an oxide layer and the second gate conductive material layer is a polysilicon layer; or the second gate dielectric layer is a high-k material layer and the second gate conductive material layer is a metal gate.

7. The semi-floating gate device according to claim 1, wherein a first side surface and a second side surface of the first control gate are respectively aligned with the first side surface and the second side surface of the floating gate structure.

8. The semi-floating gate device according to claim 7, wherein a first side surface of the second control gate and the second side surface of the first control gate are isolated by the inter-gate dielectric layer, and the first conductive type heavily doped drain region is self-aligned with a second side surface of the second control gate.

9. The semi-floating gate device according to claim 8, wherein sidewalls are formed on the first side surface of the first control gate and the second side surface of the second control gate.

10. The semi-floating gate device according to claim 8, wherein a top surface of the first control gate is in flush with a top surface of the second control gate.

11. The semi-floating gate device according to claim 4, wherein both the lightly doped source region and the lightly doped drain region consist of a first conductive type doped second well region formed on the surface of the first well region, and the gate trench passes through the second well region to divide the second well region into the lightly doped source region and the lightly doped drain region.

12. The semi-floating gate device according to claim 11, wherein an ion implantation dose for second conductive type doping in the first well region is $0.25\text{e}14\ \text{cm}^{-2}$-$2.50\text{e}14\ \text{cm}^{-2}$ and ion implantation energy is 55 keV-220 keV.

13. The semi-floating gate device according to claim 12, wherein a doping concentration of the first well region decreases in a gradient from top to bottom.

14. The semi-floating gate device according to claim 11, wherein an ion implantation dose for first conductive type doping in the second well region is $4.5\text{e}12\ \text{cm}^{-2}$-$2.50\text{e}13\ \text{cm}^{-2}$ and ion implantation energy is 45 keV-85 keV.

15. The semi-floating gate device according to claim 11, wherein an ion implantation dose for second conductive type doping in the floating gate material layer is $5.00\text{e}12\ \text{cm}^{-2}$-$3.60\text{e}13\ \text{cm}^{-2}$ and ion implantation energy is 2 keV-12 keV.

* * * * *